US009013934B2

(12) United States Patent
Lee

(10) Patent No.: US 9,013,934 B2
(45) Date of Patent: Apr. 21, 2015

(54) METHOD OF OPERATING A NONVOLATILE MEMORY BY REPROGRAMMING FAILED CELLS USING A REINFORCED PROGRAM PULSE IN AN IDLE STATE AND MEMORY SYSTEM THEREOF

(71) Applicant: Jung Hyuk Lee, Yongin-si (KR)

(72) Inventor: Jung Hyuk Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/068,076

(22) Filed: Oct. 31, 2013

(65) Prior Publication Data

US 2014/0119108 A1    May 1, 2014

(30) Foreign Application Priority Data

Nov. 1, 2012  (KR) .................. 10-2012-0122987

(51) Int. Cl.
    *G11C 7/22*    (2006.01)
    *G11C 29/08*   (2006.01)
    *G11C 29/42*   (2006.01)
    *G11C 29/44*   (2006.01)
    *G11C 29/52*   (2006.01)
    *G11C 11/16*   (2006.01)

(52) U.S. Cl.
    CPC ............ *G11C 29/08* (2013.01); *G11C 29/42* (2013.01); *G11C 29/44* (2013.01); *G11C 29/52* (2013.01); *G11C 11/1675* (2013.01); *G11C 11/1677* (2013.01); *G11C 2029/4402* (2013.01)

(58) Field of Classification Search
    USPC ........ 365/189.05, 189.16, 158, 173, 171, 200
    See application file for complete search history.

(56) References Cited

U.S. PATENT DOCUMENTS

| 5,481,498 | A  | * | 1/1996  | Han ..................... 365/185.09 |
| 6,704,230 | B1 |   | 3/2004  | DeBrosse et al. |
| 8,111,544 | B2 |   | 2/2012  | Chung et al. |
| 2003/0095450 | A1 |   | 5/2003  | Tanaka |
| 2005/0268207 | A1 |   | 12/2005 | Gallagher et al. |
| 2008/0181009 | A1 |   | 7/2008  | Arai et al. |
| 2008/0316833 | A1 |   | 12/2008 | Fong et al. |
| 2009/0238006 | A1 | * | 9/2009  | Nobunaga ............. 365/185.19 |
| 2010/0226164 | A1 |   | 9/2010  | Nagashima et al. |
| 2011/0026322 | A1 |   | 2/2011  | Ohmori et al. |
| 2012/0099378 | A1 | * | 4/2012  | Cho ..................... 365/185.19 |
| 2013/0163331 | A1 | * | 6/2013  | Yoo et al. ............. 365/185.11 |

FOREIGN PATENT DOCUMENTS

| JP | 11-162184   | A  | 6/1999  |
| JP | 2006-277822 | A  | 10/2006 |
| JP | 2006-527447 | A  | 11/2006 |
| JP | 3965287     | B2 | 8/2007  |
| JP | 2010-530596 | A  | 9/2010  |
| KR | 2008-0069534 | A | 7/2008  |
| KR | 2010-0065366 | A | 6/2010  |
| KR | 2011-0003485 | A | 1/2011  |

\* cited by examiner

*Primary Examiner* — Andrew Q Tran
(74) *Attorney, Agent, or Firm* — Harness, Dickey & Pierce, P.L.C.

(57) ABSTRACT

A memory system, and an operation method of a nonvolatile memory, include programming memory cells using a normal program pulse, reading out a first set of data from the memory cells, detecting failed cells based on the first set of data, storing information about the failed cells in a buffer, and reprogramming the failed cells using a reinforced program pulse in an idle state based on the information stored in the buffer.

20 Claims, 14 Drawing Sheets

METHOD OF OPERATING A NONVOLATILE MEMORY BY REPROGRAMMING FAILED CELLS USING A REINFORCED PROGRAM PULSE IN AN IDLE STATE AND MEMORY SYSTEM THEREOF

CROSS-REFERENCE TO RELATED APPLICATIONS

This U.S. non-provisional patent application claims priority under 35 U.S.C. §119 of Korean Patent Application No. 10-2012-0122987, filed on Nov. 1, 2012, the entire contents of which are herein incorporated by reference.

BACKGROUND

1. Field

Example embodiments of the inventive concepts relate to semiconductor memories, and more particularly, to a memory system including a nonvolatile memory and a method of operating a nonvolatile memory.

2. Description of Related Art

A semiconductor memory device is embodied using a semiconductor such as silicon Si, germanium Ge, gallium arsenide GaAs, indium phosphide InP, etc. A semiconductor memory device is classified as a volatile memory device or a nonvolatile memory device.

A volatile memory device loses its stored data when a power supply is interrupted. Examples of the volatile memory device are a static RAM (SRAM), a dynamic RAM (DRAM), a synchronous DRAM, etc. A nonvolatile memory device retains its stored data even when a power supply is interrupted. Examples of the nonvolatile memory device are a read only memory (ROM), a programmable ROM (PROM), an electrically programmable ROM (EPROM), an electrically erasable and programmable ROM (EEPROM), a flash memory device, a phase change RAM (PRAM), a magnetic RAM (MRAM), a resistive RAM (RRAM), a ferroelectric RAM (FRAM), etc.

A MRAM is being intensively studied as a next generation memory because of a high speed operation, a nonvolatile characteristic, a high integration, etc.

SUMMARY

Example embodiments relate to semiconductor memories, and more particularly, to a memory system including a nonvolatile memory and a method of operating a nonvolatile memory.

According to example embodiments of the inventive concepts, there is provided an operation method of a nonvolatile memory including programming a plurality of memory cells using a normal program pulse; reading out a first set of data from the plurality of memory cells; detecting failed cells from among the plurality of memory cells based on the first set of data; storing information about the failed cells in a buffer; and reprogramming the failed cells using a reinforced program pulse in an idle state based on the information stored in the buffer.

The reading out of the first set of data from the plurality of memory cells may be successively performed after the programming of the plurality of memory cells.

The programming of the plurality memory cells, the reading out of the first set of data, the detecting of the failed cells and the storing of the information may be successively performed in response to one command.

The operation method may further include reprogramming the failed cells using the normal program pulse, and reading out a second set of data from the plurality memory cells to detect further failed cells not programmed during the reprogramming of the failed cells, after the detecting of the failed cells and before the storing of the information, wherein the storing of the information includes storing information about the further failed cells in the buffer.

The storing of the information in the buffer may include reprogramming the failed cells using the normal program pulse, and the method may further include reading out a second set of data from the plurality of memory cells to detect further failed cells from among the plurality of memory cells, wherein the storing of the information includes storing information about the further failed cells in the buffer.

The programming of the memory cells may be performed in response to one program command. The reading out of the first set of data, the detecting of the failed cells, the reprogramming of the failed cells using the normal program pulse and the reading out of the second set of data from the plurality of memory cells to detect the further failed cells, and the storing of the information may be successively performed in response to one read command.

The detecting of the failed cells may include performing an error correction on the first set of data read out to detect the failed cells.

The programming of the plurality of memory cells may be performed in response to one program command. The reading out of the first set of data, the detecting of the failed cells and the storing of the information may be performed in response to one read command.

The operation method of a nonvolatile memory may further include applying the reinforced program pulse for a longer amount of time than that of the normal program pulse.

The operation method of a nonvolatile memory may further include applying the reinforced program pulse at a level higher than the normal program pulse.

The nonvolatile memory may be a magnetic random access memory.

According to example embodiments of the inventive concepts, there is also provided a memory system including a nonvolatile memory, and a controller configured to store information about failed cells from among a plurality of memory cells programmed using a normal program pulse of the nonvolatile memory, wherein the controller includes a reprogram buffer, and the controller is configured to control the nonvolatile memory so that the failed cells are reprogrammed using a reinforced program pulse based on the information stored in the reprogram buffer in idle time.

The controller may be configured to control the nonvolatile memory to program the plurality of memory cells, to perform a verify-read operation on the plurality of memory cells and to output a result of the verify-read operation, and to obtain information about the failed cells by comparing the result of the verify-read operation with data programmed in the memory cells.

The controller may be configured to control the nonvolatile memory to read out data from the plurality of memory cells and to output the data read out, and the controller may be configured to control the nonvolatile memory to obtain information about the failed cells by performing an error correction on the data read out and to store the information in the reprogram buffer.

The controller may be configured to control the nonvolatile memory to read out data from the plurality of memory cells and to output a result of the data read out. The controller may be configured to control the nonvolatile memory to obtain information about the failed cells by performing an error correction on the result of the data read out. The controller may be configured to control the nonvolatile memory to reprogram the failed cells, to reread out data the plurality of memory cells and to output a result of the data reread out, and the controller may be configured to control the nonvolatile memory to obtain information about the failed cells by performing an error correction on the result of the data reread out and to store the information in the reprogram buffer.

According to example embodiments, there is provided a method of operating a nonvolatile memory device including applying a bias voltage to a plurality of memory cells using a normal program pulse, wherein the plurality of memory cells have a resistance changeable from a first resistance state to a second resistance state, identifying at least one failed cell from among the plurality of memory cells having the bias voltage applied thereto, wherein a resistance of the at least one failed cell is in a state other than the second resistance state after using the normal program pulse, and reprogramming the at least one failed cell by applying a reinforced program pulse to the at least one failed cell in an idle state based on information about the at least one failed cell stored in a buffer.

The identifying of the at least one failed cell may include reading out a first set of data from the plurality memory cells having the bias voltage applied thereto, detecting the at least one failed cell, and storing the information about the at least one failed cell in the buffer.

The method may further include performing error correction after at least one selected from the detecting of the at least one failed cell and the reprogramming of the at least one failed cell.

The method may further include repeating the reprogramming of the at least one failed cell until the resistance of the at least one failed cell is in the second resistance state.

The plurality of memory cells may include a first memory cell configured to be programmed using a first pulse, wherein the first memory cell is the at least one failed cell, and a second memory cell configured to be programmed using a second pulse. The first pulse may have a greater strength than that of the second pulse, and the first memory cell may be larger than the second memory cell.

BRIEF DESCRIPTION OF THE FIGURES

Example embodiments of the inventive concepts will be described below in more detail with reference to the accompanying drawings. The embodiments of the inventive concepts may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION OF EXAMPLE EMBODIMENTS

Figure 1:
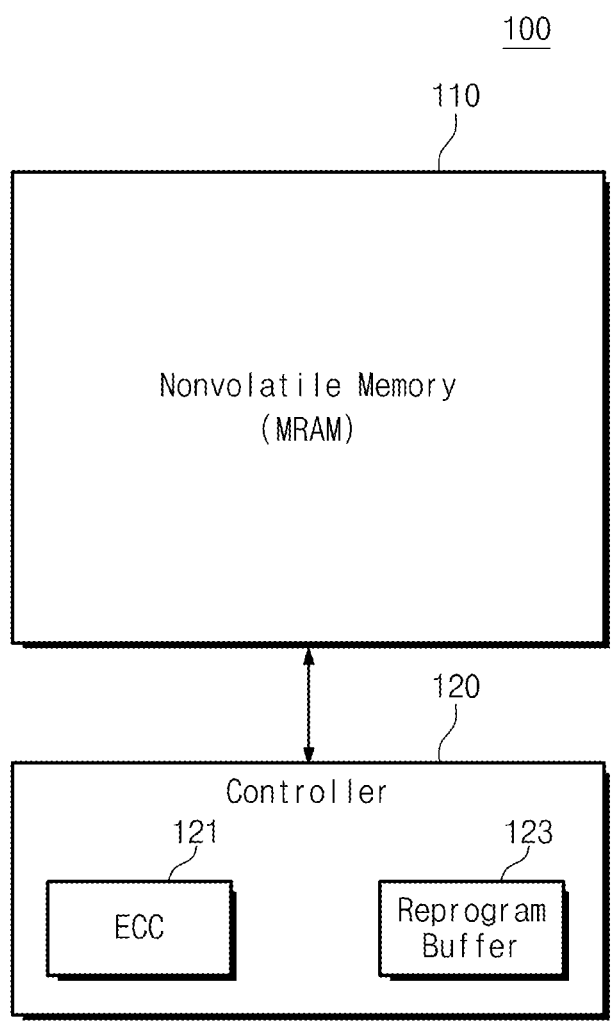
FIG. 1 is a block diagram illustrating a memory system in accordance with example embodiments of the inventive concepts.

Various example embodiments will now be described more fully with reference to the accompanying drawings in which some example embodiments are shown. However, specific structural and functional details disclosed herein are merely representative for purposes of describing example embodiments, and thus may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the disclosure.

In the drawings, the thicknesses of layers and regions may be exaggerated for clarity, and like numbers refer to like elements throughout the description of the figures.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments relate to semiconductor memories, and more particularly, to a memory system including a nonvolatile memory and a method of operating a nonvolatile memory.

FIG. 1 is a block diagram illustrating a memory system in accordance with example embodiments of the inventive concepts.

Referring to FIG. 1, a memory system 100 includes a nonvolatile memory 110 and a controller 120.

The nonvolatile memory 110 may include a magnetic random access memory (MRAM) as an illustration. However, the nonvolatile memory 110 is not limited to the magnetic random access memory (MRAM). The nonvolatile memory 110 may include at least one among various nonvolatile memories such as an electrically programmable ROM (EPROM), an electrically erasable and programmable ROM (EEPROM), a flash memory device, a phase change RAM (PRAM), a magnetic RAM (MRAM), a resistive RAM (RRAM), a ferroelectric RAM (FRAM), etc.

The controller 120 is connected to the nonvolatile memory 110. The controller is configured to access the nonvolatile memory 110. The controller 120 is configured to control read, write, erase and background operations of the nonvolatile memory 110. The controller 120 is configured to provide an interface between the nonvolatile memory 110 and a host. The controller 120 is configured to drive a firmware for controlling the nonvolatile memory 110.

The controller 120 includes an error correction code (ECC) block 121 and a reprogram buffer 123. The ECC block 121 can add parity to data to be programmed in the nonvolatile memory 110.

The ECC block 121 can correct errors to be read on the basis of data and parity being read from the nonvolatile memory 110. The ECC block 121 can generate parity and correct errors using at least one of various codes such as a low density parity check (LDPC) code, a bose-chaudhuri-hocquenghem (BCH) code, a reed-solomon (RS) code, a polar code, etc.

The reprogram buffer 123 is configured to store data. The controller 120 can store information about failed cells among memory cells of the nonvolatile memory 110 in the reprogram buffer 123. The failed cells may include memory cells which are programmed by a specific bit, but are read out to store a different bit from the specific bit. The information about the failed cells may include data to be programmed in the failed cells and location information (e.g., address) of the failed cells. On the basis of the information stored in the reprogram buffer 123, the controller 120 can control the nonvolatile memory 110 so that a reprogram is performed in an idle state.

The controller 120 may further include constitution elements such as a random access memory (RAM), a processing unit, a host interface and a memory interface. The RAM may be used as at least one of an operation memory of the processing unit, a cache memory between the nonvolatile memory 110 and the host and a buffer memory between the nonvolatile memory 110 and the host. The processing unit controls an overall operation of the controller 120.

The host interface can communicate with the nonvolatile memory 110 according to a specific communication protocol. The controller 120 is configured to communicate with the outside (host) through at least one of various communication protocols such as a USB (universal serial bus), a MMC (multimedia card), a PCI (peripheral component interconnection), a PCI-E (PCI-express), an ATA (advanced technology attachment), a serial-ATA, a parallel-ATA, a SCSI (small computer small interface), an ESDI (enhanced small disk interface), an IDE (integrated drive electronics) and Firewire. The memory interface interfaces with the nonvolatile memory 110. The memory interface includes a NAND interface or a NOR interface.

The controller 120 and the nonvolatile memory 110 may be integrated in one semiconductor device. The controller 120 and the nonvolatile memory 110 may be integrated in one semiconductor device to constitute a solid state drive (SSD). The controller 120 and the nonvolatile memory 110 may be integrated in one semiconductor device to constitute a memory card. For example, the controller 120 and the nonvolatile memory 110 may be integrated in one semiconductor device to constitute a memory card such as a personal computer memory card international association (PCMCIA) card, a compact flash (CF) card, a smart media card (SM, SMC), a memory stick, a multimedia card (MMC, RS-MMC, MMC-micro), a SD card (SD, miniSD, microSD, SDHC), a universal flash memory device (UFS), etc.

The controller 120 and the nonvolatile memory 110 may be integrated in one semiconductor device to constitute a solid state drive (SSD). The solid state drive (SSD) includes a storage device configured to store data in a semiconductor memory. In the case that the memory system 100 is used as the solid state drive (SSD), an operation speed of the host connected to the memory system 100 is greatly improved.

The memory system 100 may constitute a computer, an ultra mobile PC (UMPC), a workstation, a net-book, a personal digital assistants (PDA), a portable computer, a web tablet, a tablet computer, a wireless phone, a mobile phone, a smart phone, an e-book, a portable multimedia player (PMP), a portable game machine, a navigation device, a black box, a digital camera, a digital multimedia broadcasting (DMB) player, a three dimensional television, a smart television, a digital audio recorder, a digital audio player, a digital picture recorder, a digital picture player, a digital video recorder, a digital video player, a storage constituting a data center, a device that can transmit and receive information in a wireless environment, one of various electronic devices constituting a home network, one of various electronic devices constituting a computer network, one of various electronic devices constituting a telematics network, and one of various constituent elements constituting a RFID device or a computing system.

The nonvolatile memory 110 and the memory system 100 can be mounted by various types of packages. For example, the nonvolatile memory 110 and the memory system 100 can be mounted by various types of packages such as PoP (package on package), ball grid array (BGA), chip scale package (CSP), plastic leaded chip carrier (PLCC), plastic dual in-line package (PDIP), die in waffle pack, die in wafer form, chip on board (COB), ceramic dual in-line package (CERDIP), plastic metric quad flat pack (MQFP), thin quad flat pack (TQFP), small outline (SOIC), shrink small outline package (SSOP), thin small outline (TSOP), thin quad flatpack (TQFP), system in package (SIP), multi-chip package (MCP), wafer-level fabricated package (WFP) and wafer-level processed stack package (WSP).

Figure 2:
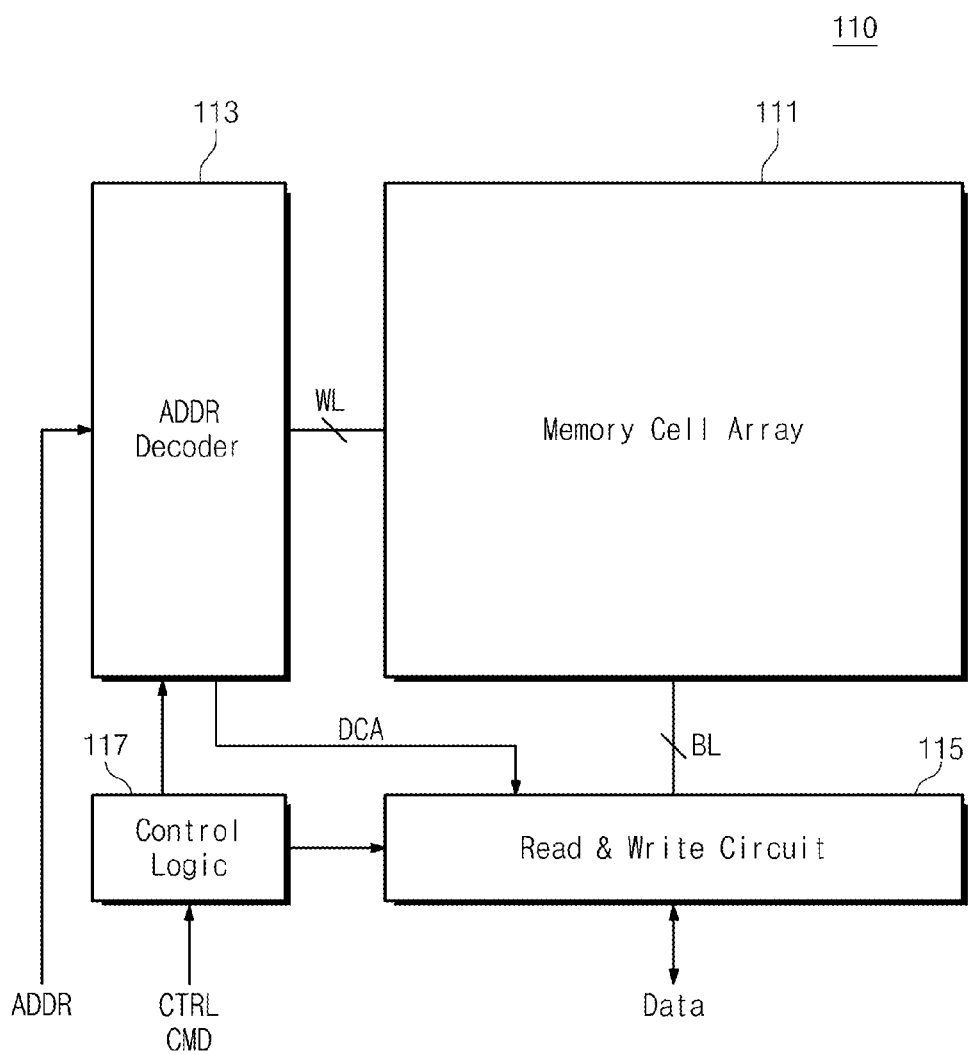
FIG. 2 is a block diagram illustrating a nonvolatile memory in accordance with example embodiments of the inventive concepts.

FIG. 2 is a block diagram illustrating a nonvolatile memory in accordance with example embodiments of the inventive concepts.

Referring to FIGS. 1 and 2, the nonvolatile memory 110 includes a memory cell array 111, an address decoder 113, a read & write circuit 115 and a control logic 117.

The memory cell array 111 is connected to the address decoder 113 through word lines WLss and connected to the read & write circuit 115 through bit lines BLss. The memory cell array 111 includes a plurality of memory cells. Memory cells arranged in a row direction are connected to the word lines WLss. Memory cells arranged in a column direction are connected to the bit lines BLss. The memory cell array 111 includes a plurality of memory cells that can store one or more bits per a cell.

The address decoder 113 is connected to the memory cell array 111 through the word lines WLss. The address decoder 113 is configured to operate in response to a control of the control logic 117. The address decoder 113 receives an address ADDR from the outside (e.g., the controller 120).

The address decoder 113 is configured to decode a row address among the received addresses ADDR. Using the decoded row address, the address decoder 113 selects word lines WLss. The address decoder 113 is configured to decode a column address among the received addresses ADDR. The decoded column address DCA is transmitted to the read & write circuit 115. The address decoder 113 includes constitution elements such as a row decoder, a column decoder, an address buffer, etc.

The read & write circuit 115 is connected to the memory cell array 111 through the bit lines BLss. The read & write circuit 115 is configured to exchange data DATA with the outside (e.g., the controller 120).

The read & write circuit 115 operates in response to a control of the control logic 117. The read & write circuit 115 is configured to receive the decoded column address DCA from the address decoder 113. Using the decoded column address DCA, the read & write circuit 115 selects bit lines BLss.

The read & write circuit 115 receives data from the outside and programs the received data in the memory cell array 111. The read & write circuit 115 reads data from the memory cell array 111 and outputs the read data to the outside. The read & write circuit 115 reads data from a first storage area of the memory cell array 111 and programs the read data in a second storage area of the memory cell array 111. The read & write circuit 115 is configured to perform a copy-back operation.

The read & write circuit 115 includes constituent elements such as a sense amplifier, a write driver, a column select circuit, a data buffer, etc.

The control logic 117 is connected to the address decoder 113 and the read & write circuit 115. The control logic 117 is configured to control an overall operation of the nonvolatile memory 110. The control logic 117 operates in response to a control signal CTRL and a command CMD being transmitted from the outside (e.g., the controller 120).

Figure 3:
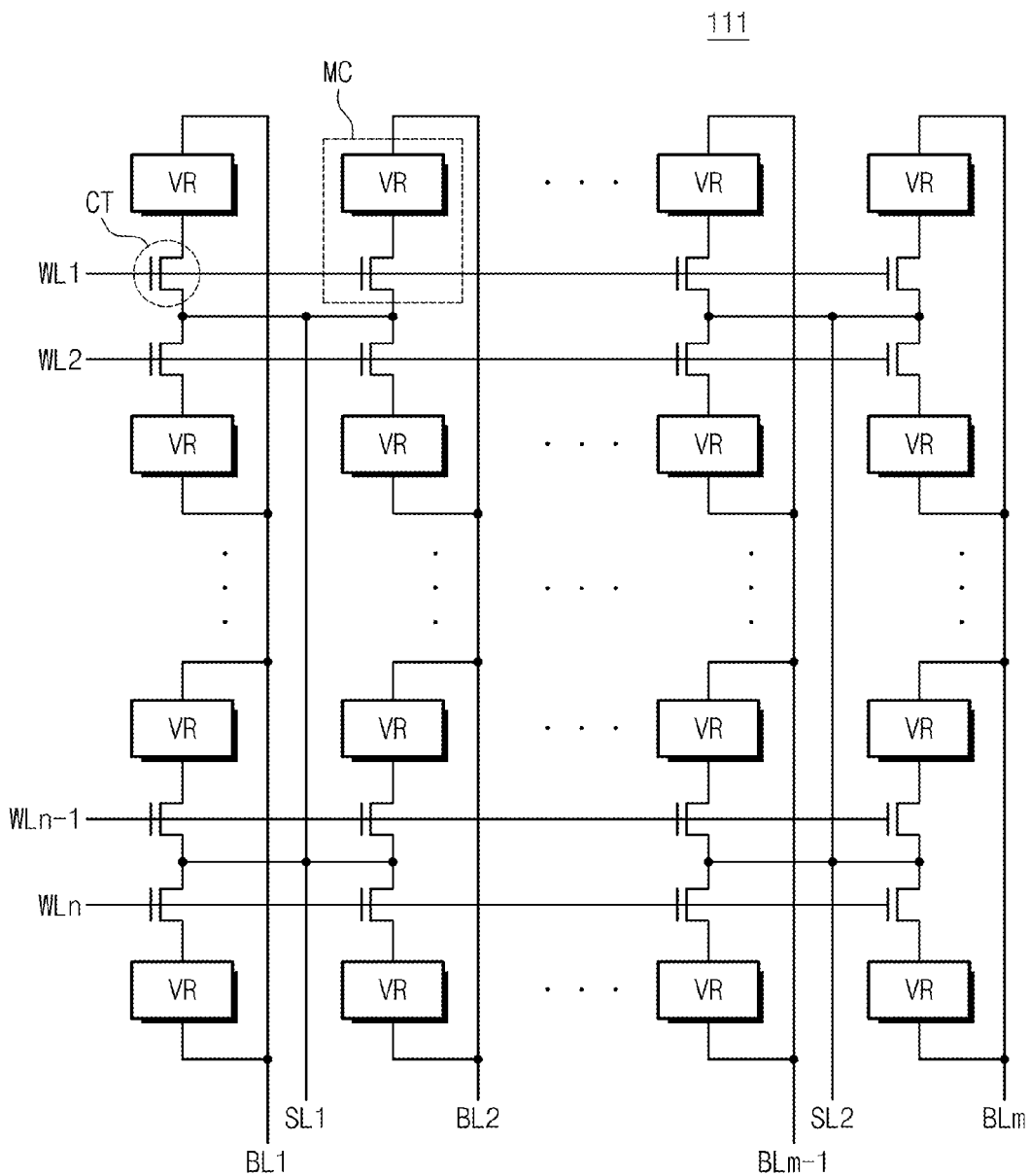
FIG. 3 is a drawing illustrating a memory cell array in accordance with example embodiments of the inventive concepts.

FIG. 3 is a drawing illustrating a memory cell array in accordance with example embodiments of the inventive concepts.

Referring to FIGS. 2 and 3, the memory cell array 111 includes a plurality of memory cells MCs. The plurality of memory cells MCs may be arranged in a matrix form along a row direction and a column direction. Each memory cell includes a variable resistance device VR and a cell transistor CT.

Gates of the cell transistors CT are connected to the word lines WL1-WLn. Gates of cell transistors CT of memory cells arranged in the same row are connected to one word line in common. Gates of cell transistors CT of memory cells arranged in different rows are connected to different word lines respectively. One end of the cell transistor CT is connected to one end of the variable resistance device VR. The other end of the cell transistor CT is connected to a source line SL1-SL2. The other ends of the cell transistors arranged in a pair of adjacent rows are connected to one source line in common. The other ends of the cell transistors arranged in a pair of adjacent columns are connected to one source line in common.

The other ends of the variable resistance devices VR are connected to the bit lines BL1~BLm. The other ends of variable resistance devices of memory cells arranged in the same column are connected to one bit line in common. The other ends of variable resistance devices of memory cells arranged in different columns are connected to different bit lines respectively.

Each of the variable resistance devices VR may have a low resistance state or a high resistance state depending on a bias condition. Data is stored in the variable resistance devices VR by controlling each of the variable resistance devices VR to one of a low resistance state and a high resistance state.

Figure 4A:
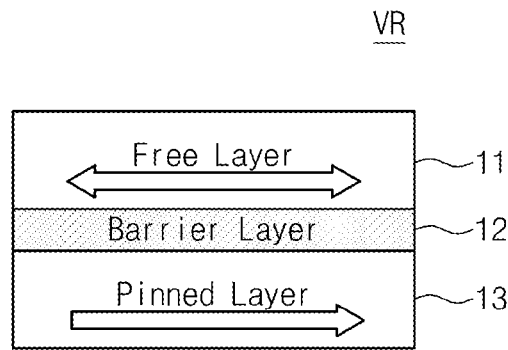
FIG. 4A illustrates a variable resistance device in accordance with the example embodiments of the inventive concepts.

FIG. 4A illustrates a variable resistance device in accordance with other example embodiments of the inventive concepts.

Referring to FIG. 4A, the variable resistance device VR includes a free layer 11, a barrier layer 12 and a pinned layer 13.

A magnetization direction of the pinned layer 13 is pinned and a magnetization direction of the free layer 11 may be the same as that of the pinned layer 13 or may be opposite to that of the free layer 11 depending on a condition. To pin a magnetization direction of the pinned layer 13, an anti-ferromagnetic layer (not shown) may be further included.

If a magnetization direction of the free layer 11 is parallel to a magnetization direction of the pinned layer 13, a resistance value of the variable resistance device VR becomes small. If a magnetization direction of the free layer 11 is anti-parallel to a magnetization direction of the pinned layer 13, a resistance value of the variable resistance device VR becomes great.

When a current flows from the free layer 11 to the pinned layer 13, electrons may flow from the pinned layer 13 to the free layer 11. Electrons flowing through the pinned layer 13 rotate according to a magnetization direction of the pinned layer 13. The free layer 11 may be magnetized by electrons being rotated. The free layer 11 may be magnetized in the same direction as the magnetization direction of the pinned layer 13.

When a current flows from the pinned layer 13 to the free layer 11, electrons may flow from the free layer 11 to the pinned layer 13. A part of electrons injected into the pinned layer 13 may be reflected from the pinned layer 13 to the free layer 11. Electrons being reflected are rotated by a magnetization direction of the pinned layer 13. A rotation direction of the electrons being reflected may be opposite to the rotation direction of the electrons described above. The free layer 11 may be magnetized by electrons being rotated. The free layer 11 may be magnetized in the opposite direction to the magnetization direction of the pinned layer 13.

Figure 4B:
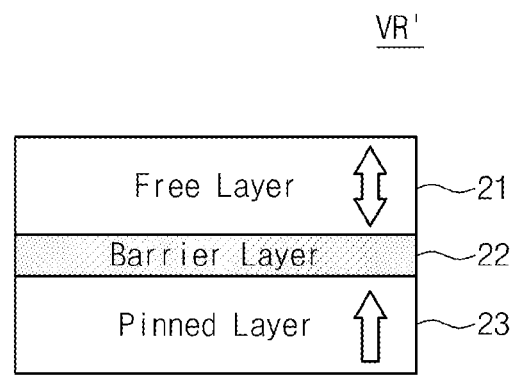
FIG. 4B illustrates a variable resistance device in accordance with other example embodiments of the inventive concepts.

FIG. 4B illustrates a variable resistance device VR' in accordance with other example embodiments of the inventive concepts.

Referring to FIG. 4B, the variable resistance device VR' includes a free layer 21, a barrier layer 22 and a pinned layer 23. Compared with the free layer 11 and the pinned layer 13 of FIG. 4A, the free layer 21 and the pinned layer 23 have a vertical magnetization direction.

To embody the variable resistance device VR' having a vertical magnetization direction, the free layer 21 and the pinned layer 23 may include a material having great magnetic anisotropy energy. Examples of materials having great magnetic anisotropy energy are amorphous rare-earth element alloy, a multi-thin film such as (Co/Pt)n or (Fe/Pt)n and an ordered lattice material of L10 crystal structure.

The free layer 21 may be an ordered alloy and may include at least one of ferrum (Fe), cobalt (Co), nickel (Ni), palladium (Pa) and platinum (Pt). The free layer 11 may include at least one of Fe—Pt alloy, Fe—Pd alloy, Co—Pd alloy, Co—Pt alloy, Fe—Ni—Pt alloy, Co—Fe—Pt alloy and Co—Ni—Pt alloy. The alloy may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$ or $Co_{30}Ni_{20}Pt_{50}$ as a chemical quantitative expression.

The pinned layer 23 may be ordered alloy and may include at least one of Ferrum (Fe), cobalt (Co), nickel (Ni), palladium (Pa) and platinum (Pt). The pinned layer 23 may include at least one of Fe—Pt alloy, Fe—Pd alloy, Co—Pd alloy, Co—Pt alloy, Fe—Ni—Pt alloy, Co—Fe—Pt alloy and Co—Ni—Pt alloy. The alloy may be $Fe_{50}Pt_{50}$, $Fe_{50}Pd_{50}$, $Co_{50}Pd_{50}$, $Co_{50}Pt_{50}$, $Fe_{30}Ni_{20}Pt_{50}$, $Co_{30}Fe_{20}Pt_{50}$ or $Co_{30}Ni_{20}Pt_{50}$ as a chemical quantitative expression.

Embodiments of the variable resistance devices VR are described with reference to FIGS. 4A and 4B. The variable resistance devices VR are designed and manufactured to have the same structure and size. However, due to a process error, sizes of the variable resistance devices VR may be different. In the case that a size of the first variable resistance device VR is greater than that of the second variable resistance device VR, strength of a pulse (e.g., a program pulse or an erase pulse) required to change a state of the first variable resistance device VR may be greater than strength of a pulse required to change a state of the second variable resistance device VR. That is, when a same pulse (e.g., a program pulse or an erase pulse) is applied, states of a part of the variable resistance devices are changed and states of the other part of the variable resistance devices may not be changed. Thus, a program error or an erase error may occur.

To solve that problem, in an operation method in accordance with example embodiments of the inventive concept, a reinforced pulse is applied to variable resistance devices of which states are not changed by a normal pulse.

Technical features of the inventive concepts are described below with reference to examples of program. The technical features of the inventive concepts are not limited to term 'program'. A program and an erasure include an operation of applying a bias to memory cells to change states of the memory cells. An erasure may be included in a program in that states of memory cells are changed by applying a bias. A program in accordance with the technical spirit of the inventive concept includes an erasure.

Figure 5:
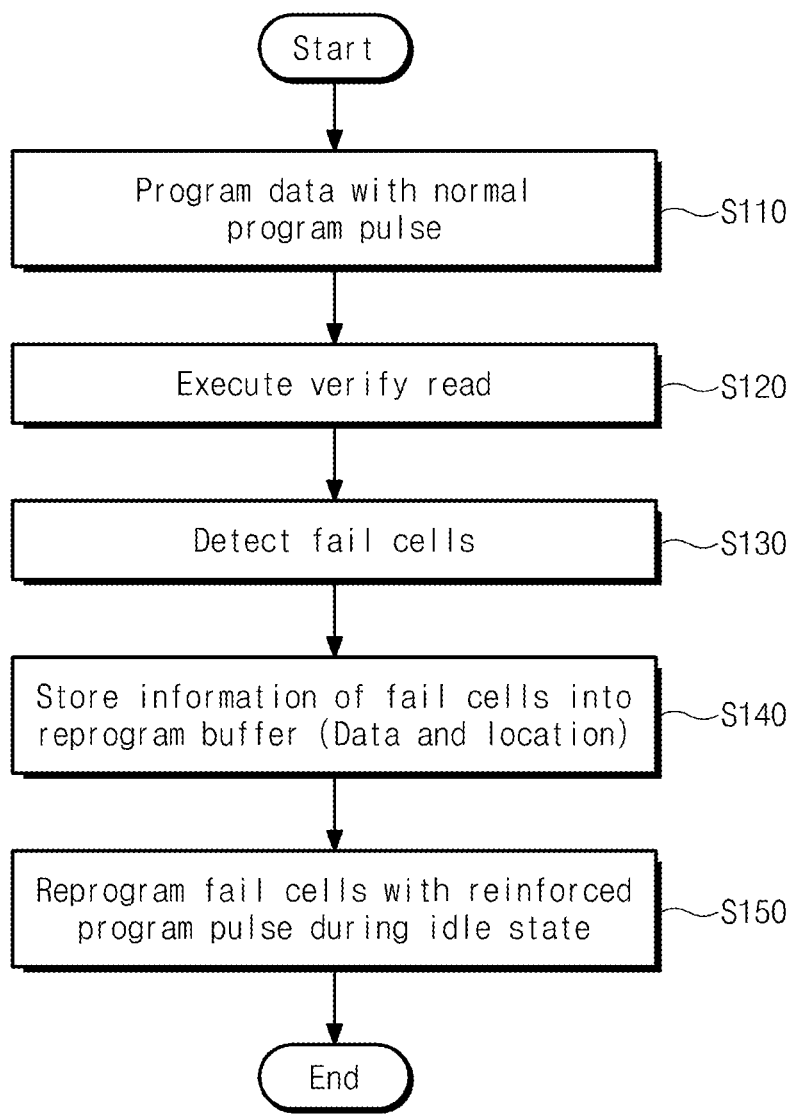
FIG. 5 is a flow chart illustrating an operation method in accordance with the example embodiments of the inventive concepts.

FIG. 5 is a flow chart illustrating an operation method in accordance with the example embodiments of the inventive concepts.

Referring to FIGS. 1 and 5, data is programmed using a normal program pulse (S110). The controller 120 may control the nonvolatile memory 110 using a normal program pulse so that data is programmed in memory cells.

Then, a verify-read operation is performed (S120). The controller 120 may control the nonvolatile memory 110 to perform the verify-read operation. The verify-read operation may include an operation of reading the memory cells programmed in S110 and outputting the data read out to the controller 120. The verify-read operation may include an operation of reading the memory cells programmed in S110, comparing the data read out with the data programmed and outputting a result of the comparison to the controller 120.

Failed cells are detected (S130). The failed cells include memory cells which are not normally programmed among memory cells programmed. Memory cells, which are read not to store a specific bit when a verification read is performed among memory cells programmed with the specific bit, may be the failed cells. That is, when a verify-read operation is performed, cells which are read to store data different from the program data may be detected as failed cells.

The controller 120 may receive data read out as a result of the verify-read operation from the nonvolatile memory 110 and may compare the received data with the program data. The controller 120 may compare the program data and the data read out with each other to detect failed cells.

The controller 120 may receive a result of the comparison from the nonvolatile memory 110 and may detect failed cells according to the received result of the comparison.

Information of failed cells is stored in the reprogram buffer 123. The information of the failed cells may include data and a location programmed in the failed cells. The information of the failed cells may include program data which is not the data to be read out when a verify-read operation is performed from the failed cells. The information of the failed cells may include addresses of the failed cells. The controller 120 may obtain information of the failed cells from a result of the detection of the failed cells and may store the obtained information in the reprogram buffer 123.

In an idle state, failed cells are programmed by a reinforced program pulse. The idle state may include a state that the memory system 100 including the controller 120 and the nonvolatile memory 110 does not perform an operation according to a command being transmitted from an external host.

In an idle state, the controller 120 can read out information of failed cells stored in the reprogram buffer 123. On the basis of the information of the failed cells, the controller 120 may control the nonvolatile memory 110 so that the failed cells are programmed using a reinforced program pulse.

Figure 6A:
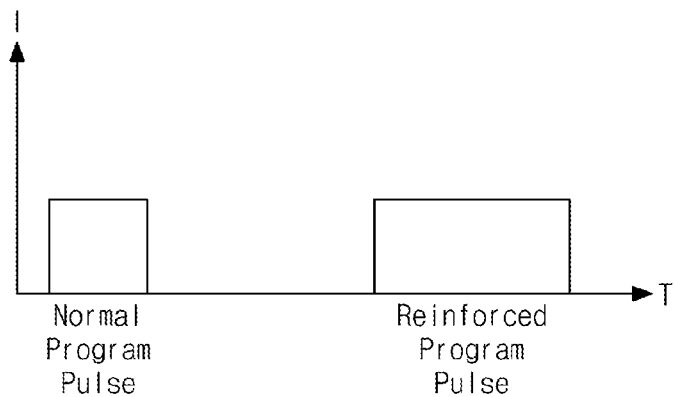
FIGS. 6A through 6C illustrate examples of a normal program pulse and a reinforced program pulse.
Figure 6B:
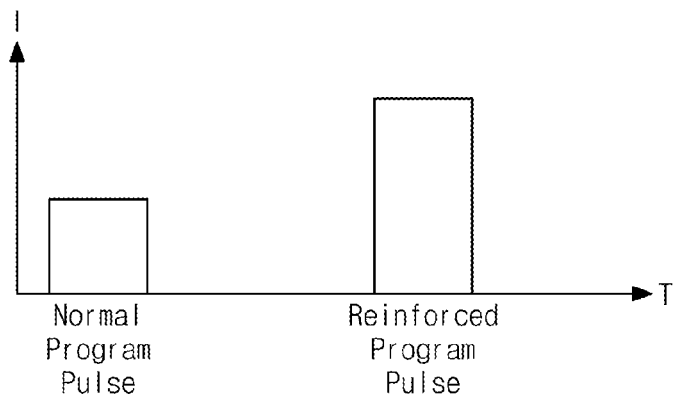
Figure 6C:
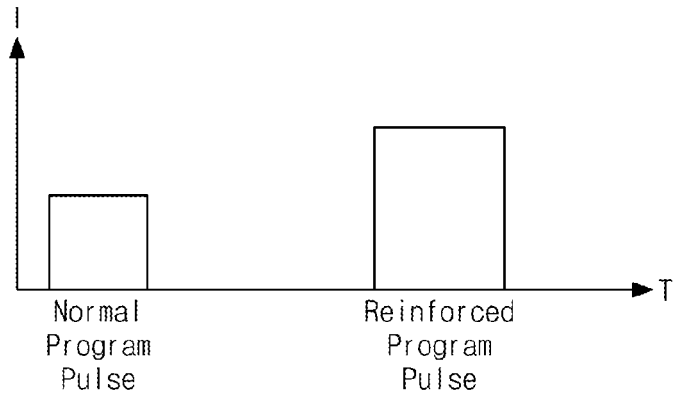

FIGS. 6A through 6C illustrate examples of a normal program pulse and a reinforced program pulse.

Referring to FIG. 6A, a reinforced program pulse may have applying time longer than that of a normal program pulse. If a program pulse is applied for long time, torque enough to magnetize the free layer (11, 21) of the variable resistance device VR is applied to the free layer (11, 21). Thus, memory cells not programmed by the normal program pulse can be normally programmed by the reinforced program pulse.

Referring to FIG. 6B, a level of the reinforced program pulse is higher than that of the normal program pulse. If a program pulse having a high level is applied, torque enough to magnetize the free layer (11, 21) of the variable resistance device VR is applied to the free layer (11, 21). Thus, memory cells not programmed by the normal program pulse can be normally programmed by the reinforced program pulse.

Referring to FIG. 6C, applying time of the reinforced program pulse is longer than that of the normal program pulse and a level of the reinforced program pulse is higher than that of the normal program pulse. If a program pulse having long applying time and a high level, torque enough to magnetize the free layer (11, 21) of the variable resistance device VR is applied to the free layer (11, 21). Thus, memory cells not programmed by the normal program pulse can be normally programmed by the reinforced program pulse.

Figure 7:
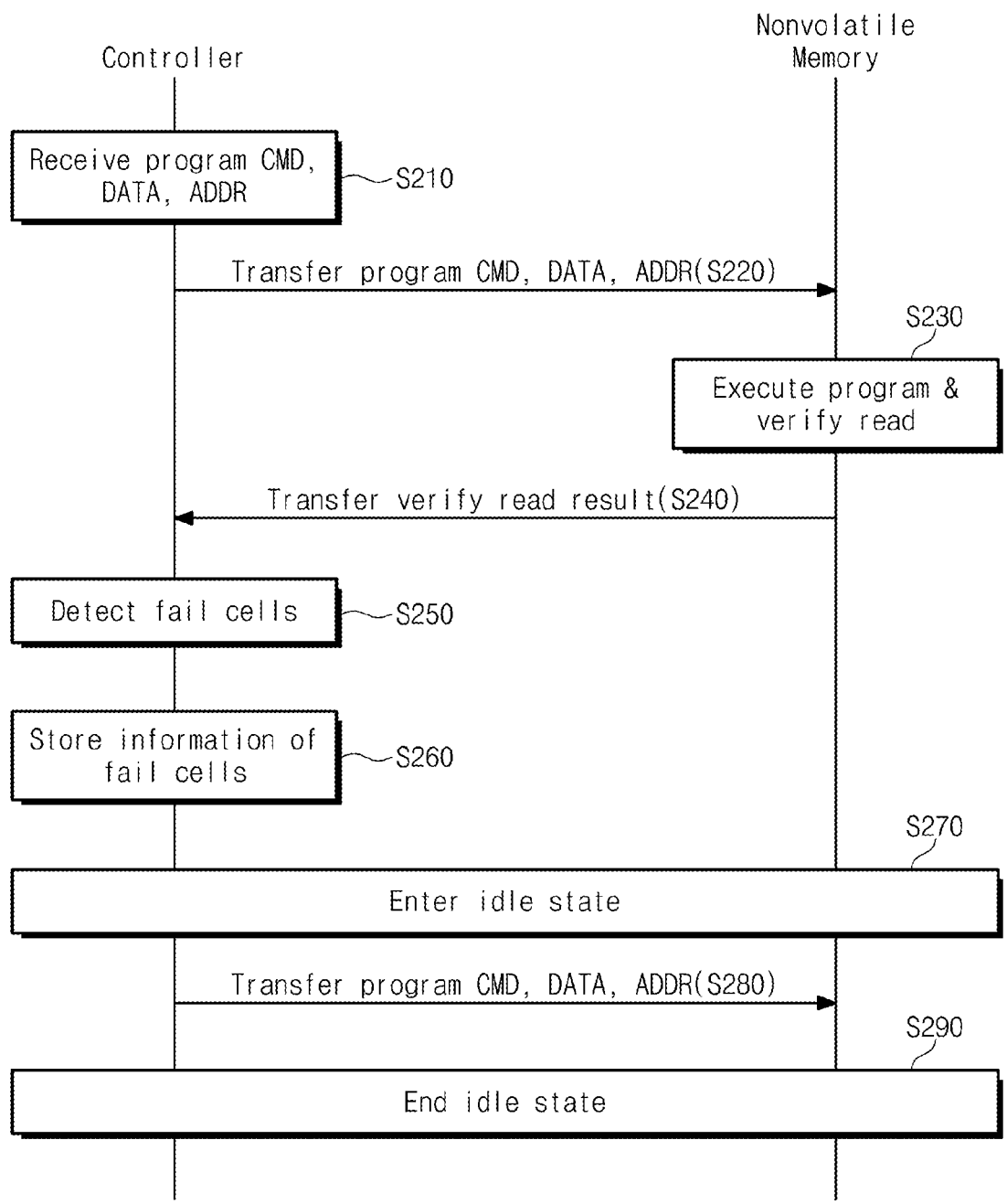
FIG. 7 is a flow chart illustrating an operation being performed by a nonvolatile memory and a controller on the basis of the operation method in accordance with the example embodiments of the inventive concepts.

FIG. 7 is a flow chart illustrating an operation being performed by the nonvolatile memory and the controller on the basis of the operation method in accordance with the example embodiments of the inventive concepts.

Referring to FIGS. 1 and 7, the controller 120 receives a program command, data and an address (S210). The controller 120 may receive a program command, data and an address from an external host.

The controller 120 transmits the program command, the data and the address that are received to the nonvolatile memory 110 (S220).

The nonvolatile memory 110 programs a program operation and a verify-read operation on the basis of the program command, the data and the address that are received to the nonvolatile memory 110 (S230).

The nonvolatile memory 110 can continuously perform a program operation and a verify-read operation in response to the received program command. The program command may be a command directing performance of a program operation and a verify-read operation. The nonvolatile memory 110 may perform a program operation in response to the received program command and may receive a separate verify-read command from the controller 120 to perform a verify-read operation. That is, the program command is a command directing performance of a program operation and a command directing a verify-read may be separately provided. The controller 120 can transmit the program command and then subsequently can transmit the verify-read command to the nonvolatile memory 110.

The nonvolatile memory 110 transmits a result of the verify-read operation to the controller 120 (S240). The nonvolatile memory 110 can transmit data read during the verify-read operation as a result of the verify-read operation. The nonvolatile memory 110 compares data read during the verify-read operation with the program data and can transmit a result of the comparison to the controller 120 as a result of the verify-read operation.

The controller 120 detects failed cells (S250). The controller 120 may receive data read during the verify-read operation from the nonvolatile memory 110 and may compare the received data with the program data. According to a result of the comparison, the controller 120 can detect failed cells. The controller 120 receives a result of the comparison from the nonvolatile memory 110 and can detect failed cells according to the result of the comparison.

The controller 120 stores information of the failed cells in the reprogram buffer 123 (S260). The controller 120 can store program data corresponding to the failed cells and addresses of the failed cells in the reprogram buffer 123.

The controller 120 and the nonvolatile memory 110 enter an idle state (S270).

The controller 120 transmits the program command, the data and the address to the nonvolatile memory 110 (S280). The controller 120 may read information of the failed cells from the reprogram buffer 123 and may transmit the program command, the data and the address to the nonvolatile memory 110 on the basis of the information of the failed cells.

The program command of S280 may be different from the program command of S220. The program command of S280 may be a program command directing performance of a program operation using a reinforced program pulse.

An idle state of the controller 120 and the nonvolatile memory 110 is put to an end (S290).

After a program operation according to the program command of S280 is performed, a verify-read operation may be further performed. The program operation and the verify-read operation may be performed according to the program command of S280 and the controller 120 may transmit a separate command directing performance of the verify-read operation to the nonvolatile memory 110. After that, the controller 120 may receive a result of the verify-read operation from the nonvolatile memory 110.

According to the result of the verify-read operation, a subsequent process may be performed. Cells, although being reprogrammed by a reinforced program pulse, which are distinguished to be failed may be bad cells. Cells, although being reprogrammed by a reinforced program pulse, which are distinguished to be failed may be reprogrammed by a further reinforced program pulse in an idle state.

Figure 8:
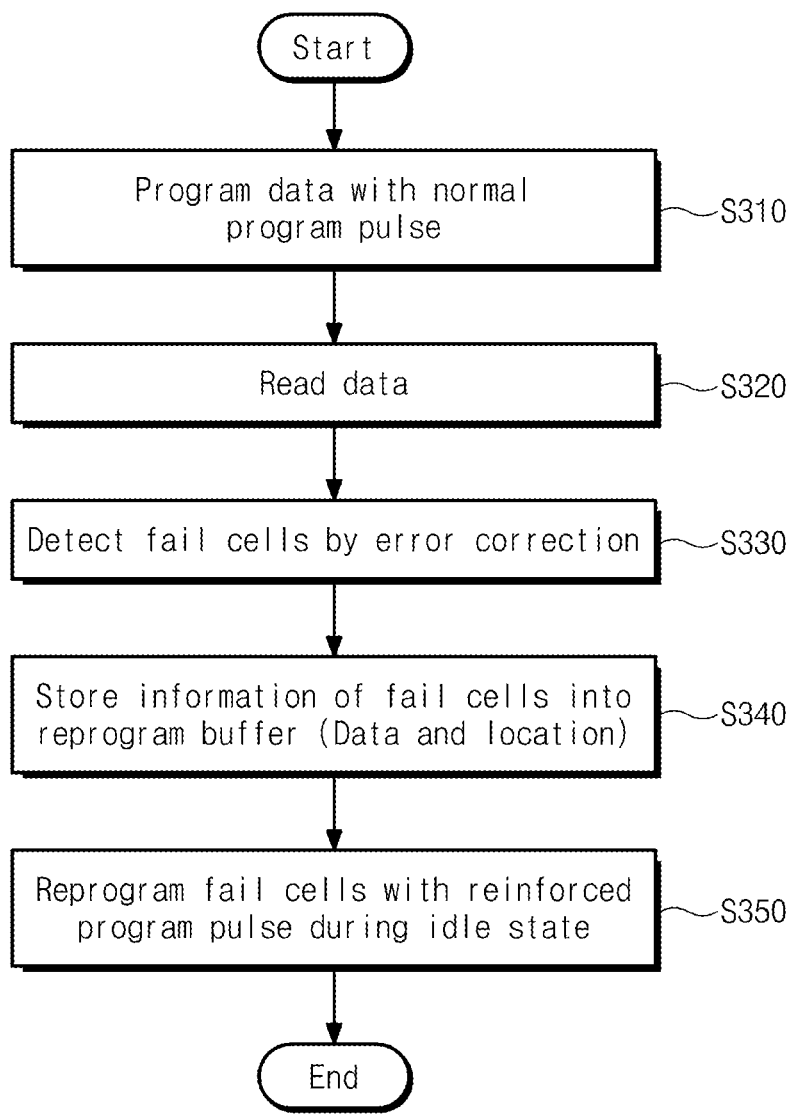
FIG. 8 is a flow chart illustrating an operation method in accordance with the other example embodiments of the inventive concepts.

FIG. 8 is a flow chart illustrating an operation method in accordance with other example embodiments of the inventive concepts.

Referring to FIGS. 1 and 8, data is programmed using a normal program pulse (S310). The controller 120 can control the nonvolatile memory 110 using a normal program pulse so that data is programmed in memory cells.

A read operation is performed (S320). The controller 120 can control the nonvolatile memory 110 to perform a read operation. The nonvolatile memory 110 can output data read out to the controller 120.

Failed cells are detected (S330). The controller 120 can detect failed cells by performing an error correction on data read out using the ECC block 121. For example, memory cells corresponding to an error bit to be detected when an error correction is performed may be determined as failed cells.

Information of the failed cells is stored in the reprogram buffer 123 (S340). The information of the failed cells may include data and location programmed in the failed cells.

In an idle state, the failed cells are programmed by a reinforced program pulse (S350). In an idle state, the controller 120 can read out information of the failed cells stored in the reprogram buffer 123. On the basis of the failed cells, the controller 120 can control the nonvolatile memory 110 so that the failed cells are programmed using a reinforced program pulse.

Figure 9:
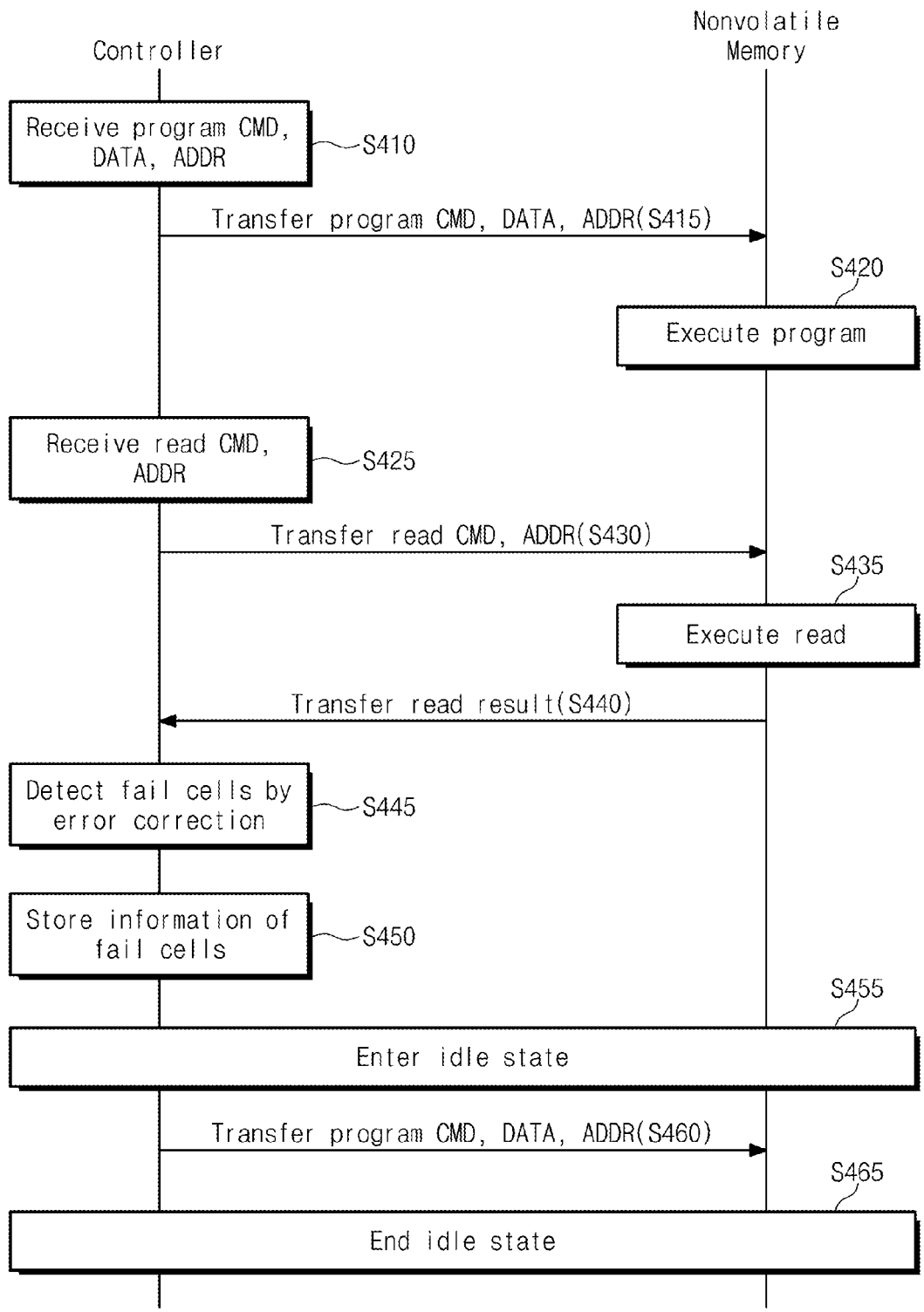
FIG. 9 is a flow chart illustrating an operation being performed by a nonvolatile memory and a controller on the basis of the operation method in accordance with the other example embodiments of the inventive concepts.

FIG. 9 is a flow chart illustrating an operation being performed by the nonvolatile memory and the controller on the basis of the operation method in accordance with the other example embodiments of the inventive concepts.

Referring to FIGS. 1 and 9, the controller 120 receives a program command, data and an address (S410). The controller 120 may receive the program command, the data and the address from an external host.

The controller 120 transmits the program command, the data and the address to the nonvolatile memory 110 (S415).

The nonvolatile memory 110 performs a program operation on the basis of the program command, the data and the address that are received (S420).

The controller 120 receives a read command and an address (S425). The controller 120 may receive the read command and the address from an external host. The time when the read command is received may be arbitrary time after the program command of S410 is received.

The controller 120 transmits the read command and the address to the nonvolatile memory 110 (S430).

The nonvolatile memory 110 performs a read operation (S435).

The nonvolatile memory 110 transmits a result of the read operation to the controller 120 (S440). The nonvolatile memory 110 may transmit data read out to the controller 120.

The controller 120 detects failed cells (S445). The controller 120 can detect the failed cells by performing an error correction on the data read out. Memory cells corresponding to an error bit being detected when an error correction is performed may be detected to be failed cells. The error corrected data may be output to an external host.

The controller 120 stores information of the failed cells in the reprogram buffer 123 (S450). The controller 120 can store program data corresponding to the failed cells and addresses of the failed cells in the reprogram buffer 123.

The controller 120 and the nonvolatile memory 110 enter an idle state (S455).

The controller 120 transmits the program command, the data and the address to the nonvolatile memory 110 (S460). The controller 120 reads out the information of the failed cells from the reprogram buffer 123 and may transmit the program command, the data and the address to the nonvolatile memory 110 on the basis of the information of the failed cells.

The program command of S460 may be different from the program command of S220. The program command of S460 may be a program command directing performance of a program operation using a reinforced program pulse.

An idle state of the controller 120 and the nonvolatile memory 110 is put to an end (S465).

After a program operation according to the program command of S460 is performed, a verify-read operation may be further performed. The program operation and the verify-read operation may be performed according to the program command of S460 and the controller 120 may transmit a separate command directing performance of the verify-read operation to the nonvolatile memory 110. After that, the controller 120 may receive a result of the verify-read operation from the nonvolatile memory 110.

According to the result of the verify-read operation, a subsequent process may be performed. Cells, although being reprogrammed by a reinforced program pulse, which are distinguished to be failed may be distinguished to be bad cells. Cells, although being reprogrammed by a reinforced program pulse, which are distinguished to be failed may be reprogrammed by a further reinforced program pulse in an idle state.

The operation method according to the example embodiments described with reference to FIGS. 6 and 7 and the operation method according to the other example embodiments described with reference to FIGS. 8 and 9 may be combined with each other to be applied. For instance, if a reprogram operation is performed using a reinforced program pulse according to a result of a verify-read operation after a program operation is performed, and then a read operation is performed at arbitrary time, a reprogram operation may be performed using a reinforced program pulse according to a result of the read operation. The reprogram operation according to the result of the verify-read operation can detect and reprogram failed cells having a bad program characteristic. The reprogram operation according to the result of the verify-read operation can detect and reprogram failed cells having a bad retention characteristic.

Figure 10:
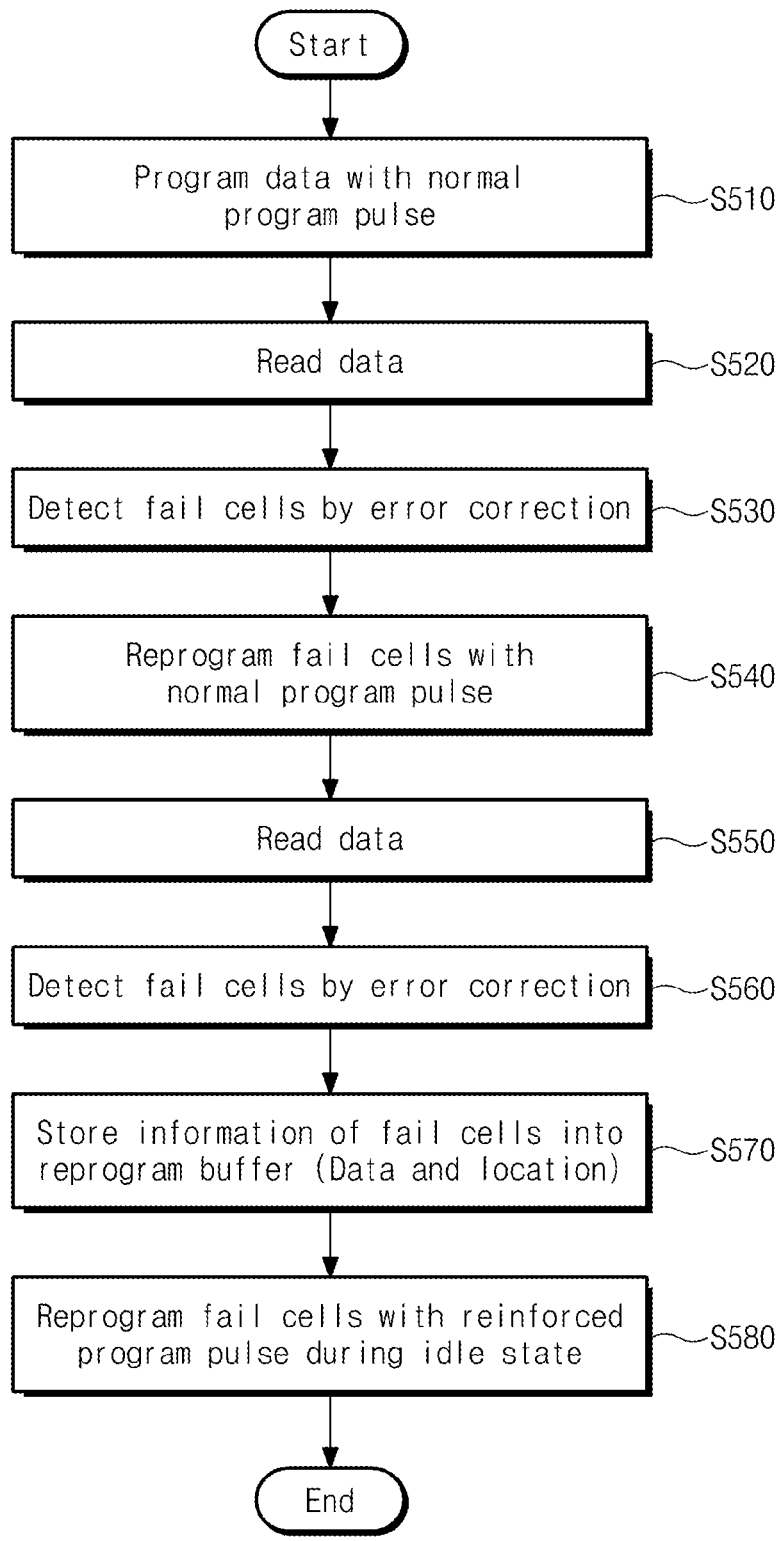
FIG. 10 is a flow chart illustrating an operation method in accordance with further example embodiments of the inventive concepts.

FIG. 10 is a flow chart illustrating an operation method in accordance with further example embodiments of the inventive concepts.

Referring to FIGS. 1 and 10, data is programmed using a normal program pulse (S510). The controller 120 can control the nonvolatile memory 110 using a normal program pulse so that data is programmed in memory cells.

A read operation is performed (S520). The controller 120 can control the nonvolatile memory 110 to perform a read operation. The nonvolatile memory 110 can output data read out to the controller 120. The read operation of S520 may be performed at arbitrary time after the program operation of S510 is performed.

Failed cells are detected (S530). The controller 120 can detect failed cells by performing an error correction on data read out using the error correction unit 121. Memory cells corresponding to an error bit being detected when an error correction is performed may be distinguished to be failed cells.

The failed cells are reprogrammed using a normal program pulse (S540). The controller 120 may control the nonvolatile memory 110 to reprogram the failed cells on the basis of information of the failed cells.

The detection operation of S530 and the reprogram operation of S540 may be successively (or, sequentially) performed after the read operation of S520.

A read operation is performed (S550). The controller 120 can control the nonvolatile memory 110 to perform a read operation. The read operation of S550 may be a verify-read operation subsequent to the reprogram operation of S540.

The reprogram operation of S540 and the read operation of S550 may be performed by different commands from each other. The controller 120 may transmit a program command to the nonvolatile memory 110 in S540 and may transmit a read command to the nonvolatile memory 110 in S550. The program command of S510 and the program command of S550 may be the same.

The reprogram operation of S540 and the read operation of S550 may be performed by one command. In S540, the controller 120 can transmit the program command to the nonvolatile memory 110. The nonvolatile memory 110 can perform the reprogram operation of S540 and the read operation of S550 in response to the program command. The program command of S540 may be different from the program command of S510.

Failed cells are detected (S560). The controller 120 can detect failed cells by performing an error correction on data read out using the error correction unit 121. Memory cells corresponding to an error bit being detected when an error correction is performed may be failed cells. The controller 120 can detect the failed cells by comparing the data read out and the error corrected data in S530.

Information of the failed cells is stored in the reprogram buffer 123 (S570). The information of the failed cells may include data and location programmed in the failed cells.

In an idle state, the failed cells are programmed by a reinforced program pulse (S580). In an idle state, the controller 120 can read out information of the failed cells stored in the reprogram buffer 123. On the basis of the failed cells, the controller 120 can control the nonvolatile memory 110 so that the failed cells are programmed using a reinforced program pulse.

Figure 11:
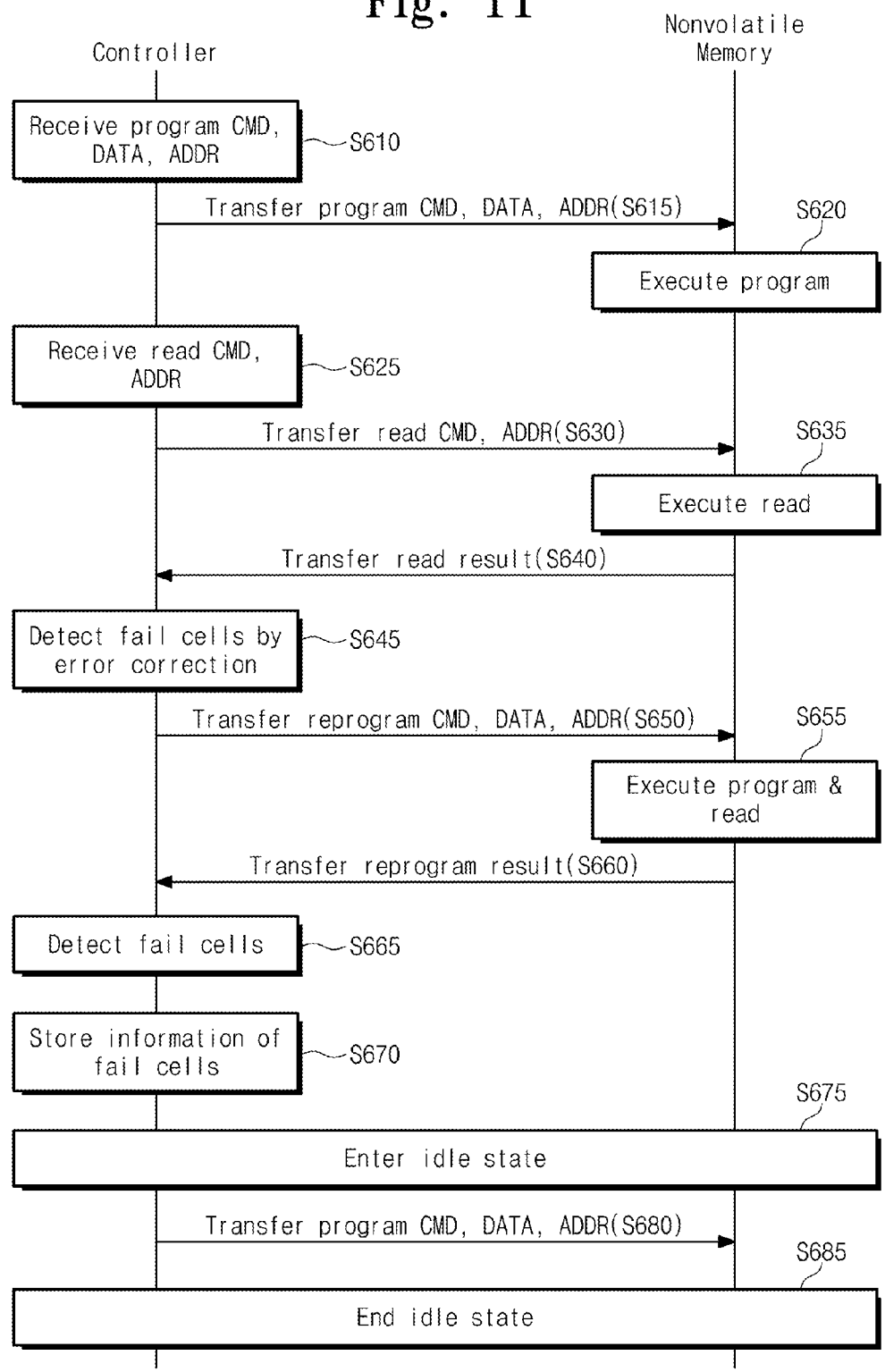
FIG. 11 is a flow chart illustrating an operation being performed by a nonvolatile memory and a controller on the basis of the operation method in accordance with the further example embodiments of the inventive concepts.

FIG. 11 is a flow chart illustrating an operation being performed by a nonvolatile memory and a controller on the basis of the operation method in accordance with a the further example embodiments of the inventive concepts.

Referring to FIGS. 1 and 11, the controller 120 receives a program command, data and an address (S610). The controller 120 may receive the program command, the data and the address from an external host.

The controller 120 transmits the program command, the data and the address to the nonvolatile memory 110 (S615).

The nonvolatile memory 110 performs a program operation on the basis of the program command, the data and the address that are received (S620).

The controller 120 receives a read command and an address (S625). The controller 120 may receive the read command and the address from an external host. The time when the read command is received may be arbitrary time after the program command of S610 is received.

The controller 120 transmits the read command and the address to the nonvolatile memory 110 (S630).

The nonvolatile memory 110 performs a read operation (S635).

The nonvolatile memory 110 transmits a result of the read operation to the controller 120 (S640). The nonvolatile memory 110 may transmit data read out to the controller 120.

The controller 120 detects failed cells (S615). The controller 120 can detect the failed cells by performing an error correction on the data read out. Memory cells corresponding to an error bit being detected when an error correction is performed may be detected to be failed cells. The error corrected data may be output to an external host.

The controller 120 transmits the program command, the data and the address to the nonvolatile memory 110 (S650).

The nonvolatile memory 110 performs a program operation and a verify-read operation (S655). The program operation may be performed using a normal program pulse. The verify-read operation may be performed in response to the program command of S650 or a separate program command being transmitted from the controller 120. The program command of S650 may be the same as or different from the program command of S615.

The nonvolatile memory 110 transmits a result of the read operation to the controller 120 (S660).

The controller 120 detects failed cells (S665). The controller 120 can detect the failed cells by performing an error correction of the data read out or comparing the error corrected data in S645 with the data read out.

The controller 120 stores information of the failed cells in the reprogram buffer 123 (S670). The controller 120 can store program data corresponding to the failed cells and addresses of the failed cells in the reprogram buffer 123.

The controller 120 and the nonvolatile memory 110 enter an idle state (S675).

The controller 120 transmits the program command, the data and the address to the nonvolatile memory 110 (S680). The controller 120 reads out the information of the failed cells from the reprogram buffer 123 and can transmit the program command, the data and the address to the nonvolatile memory 110 on the basis of the information of the failed cells.

The program command of S680 may be different from the program command of S620 or S650. The program command of S680 may be a program command directing performance of the program operation using a reinforced program pulse.

An idle state of the controller 120 and the nonvolatile memory 110 is put to an end (S685).

After a program operation according to the program command of S680 is performed, a verify-read operation may be further performed. The program operation and the verify-read operation may be performed according to the program command of S680 and the controller 120 may transmit a separate command directing performance of the verify-read operation to the nonvolatile memory 110. After that, the controller 120 may receive a result of the verify-read operation from the nonvolatile memory 110.

According to the result of the verify-read operation, a subsequent process may be performed. Cells, although being reprogrammed by a reinforced program pulse, which are distinguished to be failed may be bad cells. Cells, although being reprogrammed by a reinforced program pulse, which are distinguished to be failed may be reprogrammed by a further reinforced program pulse in an idle state.

Figure 12:
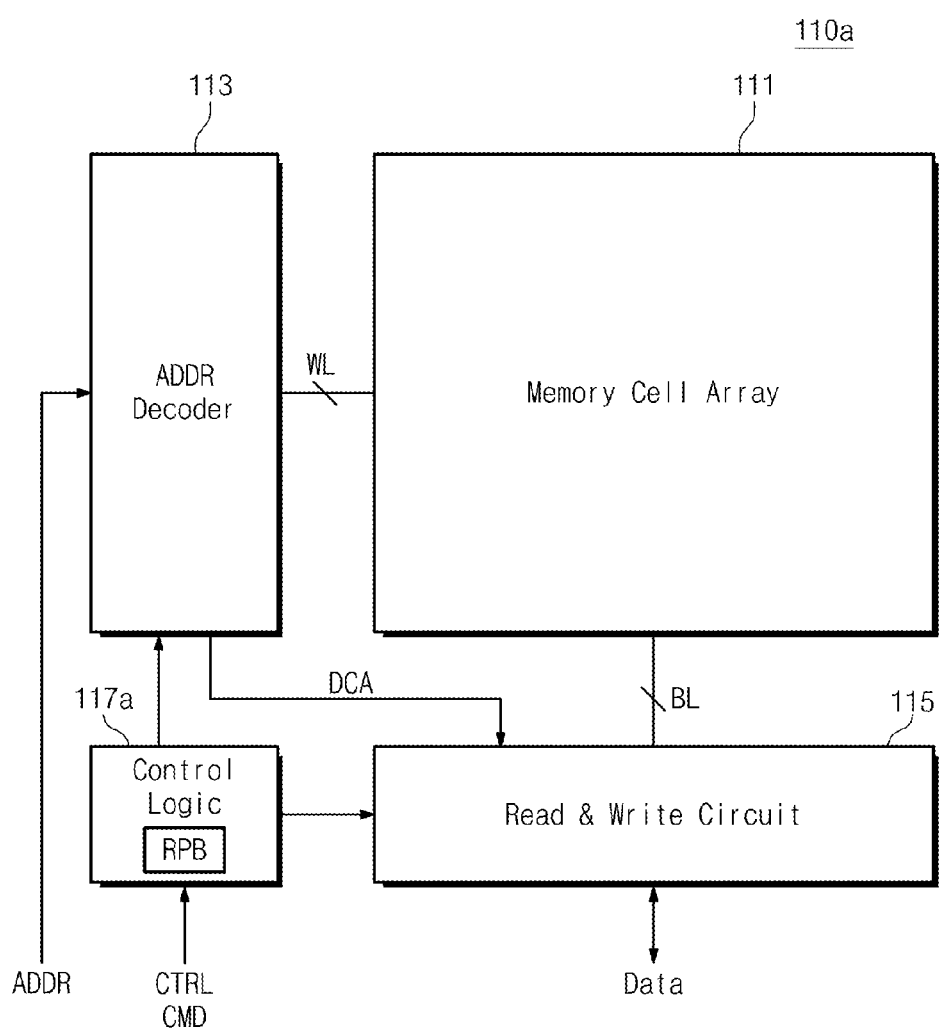
FIG. 12 is a block diagram illustrating a nonvolatile memory in accordance with other example embodiments of the inventive concepts.

FIG. 12 is a block diagram illustrating a nonvolatile memory in accordance with the other example embodiments of the inventive concepts.

Referring to FIG. 12, the nonvolatile memory 110*a* includes a memory cell array 111, an address decoder 113, a read & write circuit 115 and a control logic 117*a*.

Compared with the nonvolatile memory 110 of FIG. 2, the control logic 117*a* of the nonvolatile memory 110*a* includes a reprogram buffer RPB.

The control logic 117*a* can store information of failed cells in the reprogram buffer RPB. The control logic 117*a*, as described with reference to FIGS. 5 and 7, can perform a verify-read operation after a program operation and can store the information of the failed cells in the reprogram buffer RPB. When the nonvolatile memory 110*a* is in an idle state, the control logic 117*a* can reprogram the failed cells on the basis of the information of the failed cells stored in the reprogram buffer RPB.

The control logic 117*a* may further include an error correction unit (not shown). When the control logic 117*a* further includes the error correction unit, the control logic 117*a*, as described with reference to FIGS. 8 through 11, can detect failed cells according to a result of read operation performed at arbitrary time. The control logic 117a stores information of the failed cells in the reprogram buffer RPB and can reprogram the failed cells on the basis of the information of the failed cells.

Figure 13:
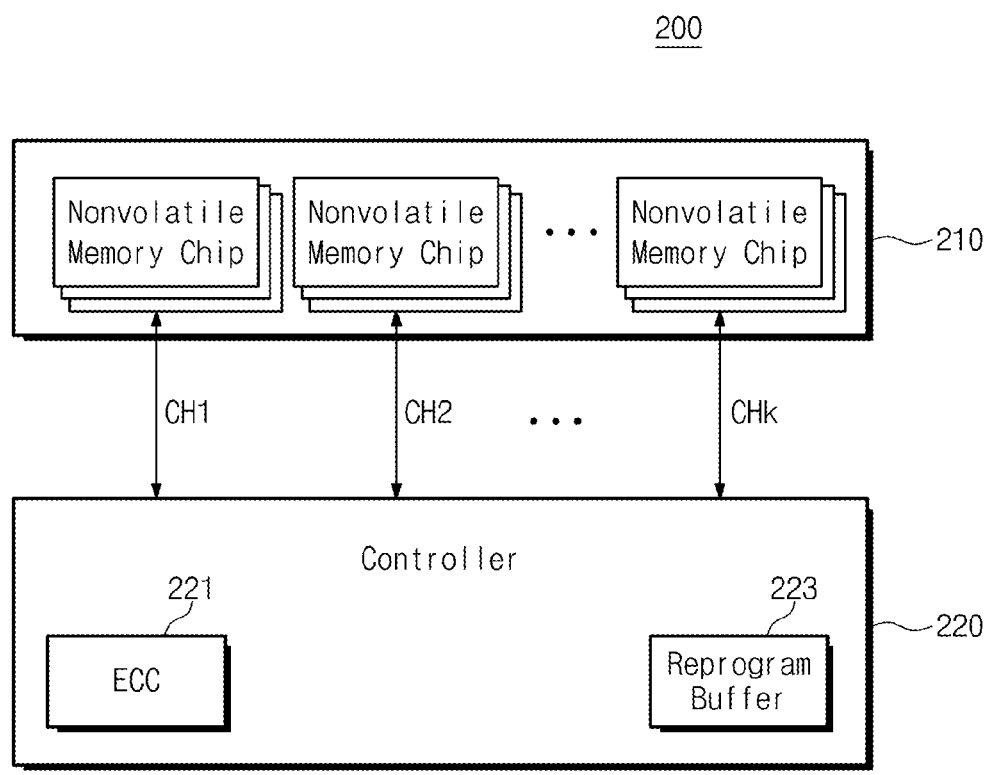
FIG. 13 is a block diagram illustrating an application example of the memory system of FIG. 1.

FIG. 13 is a block diagram illustrating an application example of the memory system of FIG. 1.

Referring to FIG. 13, a memory system 200 includes a nonvolatile memory device 210 and a controller 220. The nonvolatile memory device 210 includes a plurality of nonvolatile memory chips. The plurality of nonvolatile memory chips is divided into a plurality of groups. Each group is configured to communicate with the controller 220 through one common channel. The plurality of nonvolatile memory chips communicates with the controller 220 through first through k$^{th}$ channels CH1~CHk.

The controller 220 includes an error correction unit 221 and a reprogram buffer 223. As described with reference to FIGS. 1 through 11, the controller 220 can store information about failed cells in the reprogram buffer 223 and can reprogram the failed cells using the information of the failed cells.

As described with reference to FIG. 12, the error correction unit 221 or the reprogram buffer 223 may be provided to each nonvolatile memory chip.

In FIG. 13, the plurality of nonvolatile memory chips is connected to one channel. The memory system 200 may be modified so that one nonvolatile memory chip is connected to one channel.

Figure 14:
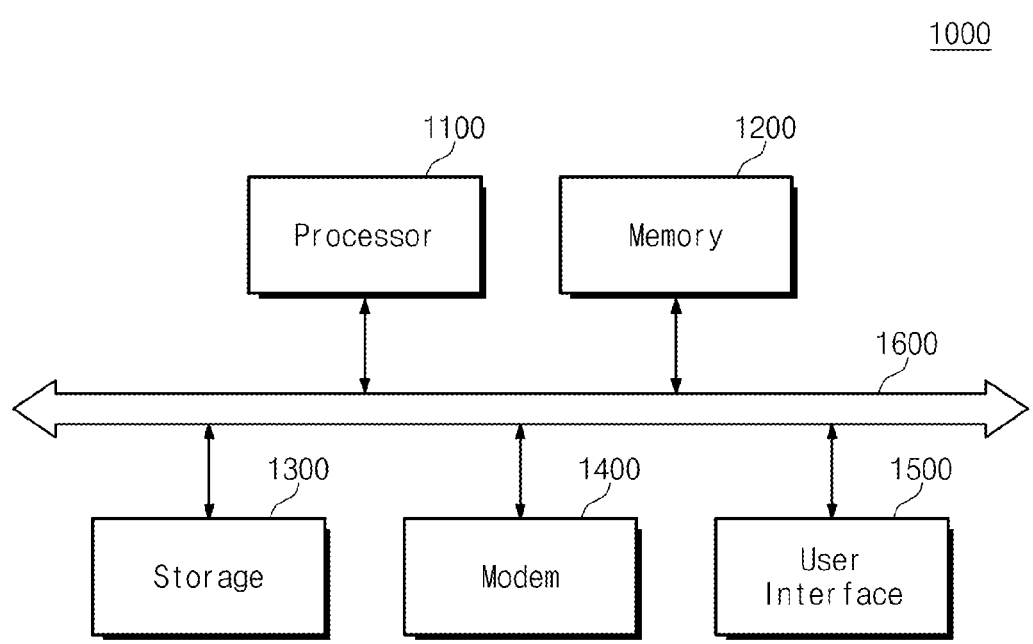
FIG. 14 is a block diagram illustrating a computing system in accordance with example embodiments of the inventive concepts.

FIG. 14 is a block diagram illustrating a computing system in accordance with example embodiments of the inventive concepts.

Referring to FIG. 14, a computing system 1000 includes a processor 1100, a memory 1200, storage 1300, a modem 1400, a user interface 1500 and a system bus 1600.

The processor 1100 can control the overall operation of the computing system 1000 and can perform a logical operation.

The memory 1200 may be an operation memory of the computing system 1000. The memory 1200 may include a volatile or nonvolatile random access memory.

The storage 1300 may be a main storage place of the computing system 1000. The storage 1300 may be used to store data that needs to be preserved in the long term. The storage 1300 may include a nonvolatile memory, a hard disk drive, etc.

The modem 1400 can perform a wire or wireless communication with an external device.

The user interface 1500 may include at least one of various user input interfaces such as a keyboard, a button, a touch pad, a touch panel, a camera, a mike, etc. or at least one of various user output interfaces such as a speaker, a monitor, a LCD device, an OLED device, an AMOLED display device, a printer, a ramp, a motor, etc.

The system bus 1600 can provide a channel between constituent elements of the computing system 1000.

The memory systems 100 and 200 in accordance with example embodiments of the inventive concepts may be embodied by the memory 1200 or the storage 1300. In the case that the memory 1200 and the storage 1300 are constituted by the same types of nonvolatile memories, the memory 1200 and the storage 1300 may be integrated in one memory.

According to example embodiments of the inventive concepts, failed cells are reprogrammed by a reinforced program pulse in an idle state. Because the failed cells are normally programmed, a memory system including a nonvolatile memory having improved reliability and an operation method of the nonvolatile memory are provided.

The foregoing is illustrative of example embodiments and is not to be construed as limiting thereof. Although a few example embodiments have been described, those skilled in the art will readily appreciate that many modifications are possible in example embodiments without materially departing from the novel teachings. Accordingly, all such modifications are intended to be included within the scope of the disclosure as defined in the claims. Therefore, it is to be understood that the foregoing is illustrative of various example embodiments and is not to be construed as limited to the specific embodiments disclosed, and that modifications to the disclosed embodiments, as well as other embodiments, are intended to be included within the scope of the appended claims.

What is claimed is:

1. An operation method of a nonvolatile memory, comprising:

programming a plurality of memory cells using a normal program pulse;

reading out a first set of data from the plurality of memory cells;

detecting failed cells from among the plurality memory cells based on the first set of data;

storing information about the failed cells in a buffer; and reprogramming the failed cells using a reinforced program pulse in an idle state based on the information stored in the buffer.

2. The operation method of a nonvolatile memory of claim 1, wherein the reading out of the first set of data from the plurality of memory cells is successively performed after the programming of the plurality of memory cells.

3. The operation method of a nonvolatile memory of claim 1, wherein the programming of the plurality memory cells, the reading out of the first set of data, the detecting of the failed cells and the storing of the information are successively performed in response to one command.

4. The operation method of a nonvolatile memory of claim 1, further comprising:

reprogramming the failed cells using the normal program pulse; and reading out a second set of data from the plurality memory cells to detect further failed cells not programmed during the reprogramming of the failed cells, after the detecting of the failed cells and before the storing of the information, wherein the storing of the information includes storing information about the further failed cells in the buffer.

5. The operation method of a nonvolatile memory of claim 4, wherein the programming of the memory cells is performed in response to one program command, and wherein the reading out of the first set of data, the detecting of the failed cells, the reprogramming of the failed cells using the normal program pulse and the reading out of the second set of data from the plurality of memory cells to detect the further failed cells, and the storing of the information are successively performed in response to one read command.

6. The operation method of a nonvolatile memory of claim 4, wherein the detecting of the failed cells includes performing an error correction on the first set of data read out to detect the failed cells.

7. The operation method of a nonvolatile memory of claim 1, wherein the storing of the information in the buffer includes reprogramming the failed cells using the normal program pulse, and further comprising:

reading out a second set of data from the plurality of memory cells to detect further failed cells from among the plurality of memory cells, wherein the storing of the information includes storing information about the further failed cells in the buffer.

8. The operation method of a nonvolatile memory of claim 1, wherein the programming of the plurality of memory cells is performed in response to one program command, and wherein the reading out of the first set of data, the detecting of the failed cells and the storing of the information are performed in response to one read command.

9. The operation method of a nonvolatile memory of claim 1, further comprising:

applying the reinforced program pulse for a longer amount of time than that of the normal program pulse.

10. The operation method of a nonvolatile memory of claim 1, further comprising:

applying the reinforced program pulse at a level higher than the normal program pulse.

11. The operation method of a nonvolatile memory of claim 1, wherein the nonvolatile memory is a magnetic random access memory.

12. A memory system, comprising:

a nonvolatile memory; and a controller configured to store information about failed cells from among a plurality of memory cells programmed using a normal program pulse of the nonvolatile memory, wherein the controller includes a reprogram buffer, and wherein the controller is configured to control the nonvolatile memory so that the failed cells are reprogrammed using a reinforced program pulse based on the information stored in the reprogram buffer in idle time.

13. The memory system of claim 12, wherein the controller is configured to control the nonvolatile memory to program the plurality of memory cells, to perform a verify-read operation on the plurality of memory cells and to output a result of the verify-read operation, and to obtain information about the failed cells by comparing the result of the verify-read operation with data programmed in the memory cells.

14. The memory system of claim 12, wherein the controller is configured to control the nonvolatile memory to read out data from the plurality of memory cells and to output the data read out, and the controller is configured to control the nonvolatile memory to obtain information about the failed cells by performing an error correction on the data read out and to store the information in the reprogram buffer.

15. The memory system of claim 12, wherein the controller is configured to control the nonvolatile memory to read out data from the plurality of memory cells and to output a result of the data read out, the controller is configured to control the nonvolatile memory to obtain information about the failed cells by performing an error correction on the result of the data read out, the controller is configured to control the nonvolatile memory to reprogram the failed cells, to reread out data from the plurality of memory cells and to output a result of the data reread out, and the controller is configured to control the nonvolatile memory to obtain information about the failed cells by performing an error correction on the result of the data reread out and to store the information in the reprogram buffer.

16. A method of operating a nonvolatile memory device, comprising:

applying a bias voltage to a plurality of memory cells using a normal program pulse, wherein the plurality of memory cells have a resistance changeable from a first resistance state to a second resistance state;

identifying at least one failed cell from among the plurality of memory cells having the bias voltage applied thereto, wherein a resistance of the at least one failed cell is in a state other than the second resistance state after using the normal program pulse; and reprogramming the at least one failed cell by applying a reinforced program pulse to the at least one failed cell in an idle state based on information about the at least one failed cell stored in a buffer.

17. The method of claim 16, wherein the identifying of the at least one failed cell includes, reading out a first set of data from the plurality memory cells having the bias voltage applied thereto;

detecting the at least one failed cell; and storing the information about the at least one failed cell in the buffer.

18. The method of claim 17, further comprising:

performing error correction after at least one selected from the detecting of the at least one failed cell and the reprogramming of the at least one failed cell.

19. The method of claim 16, further comprising:

repeating the reprogramming of the at least one failed cell until the resistance of the at least one failed cell is in the second resistance state.

20. The method of claim 16, wherein, the plurality of memory cells include, a first memory cell configured to be programmed using a first pulse, wherein the first memory cell is the at least one failed cell, and second memory cell configured to be programmed using a second pulse, the first pulse has a greater strength than that of the second pulse, and the first memory cell is larger than the second memory cell.

* * * * *